(12) United States Patent
Zhan et al.

(10) Patent No.: US 7,911,750 B2
(45) Date of Patent: Mar. 22, 2011

(54) RESISTOR TRIGGERED ELECTROSTATIC DISCHARGE PROTECTION

(75) Inventors: Rouying Zhan, Gilbert, AZ (US); Chai Ean E. Gill, Chandler, AZ (US); James D. Whitfield, Gilbert, AZ (US); Hongzhong Xu, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 446 days.

(21) Appl. No.: 12/038,146

(22) Filed: Feb. 27, 2008

(65) Prior Publication Data

US 2009/0213506 A1 Aug. 27, 2009

(51) Int. Cl.
*H02H 9/00* (2006.01)
(52) U.S. Cl. .......................................... 361/56
(58) Field of Classification Search .................. 361/56
See application file for complete search history.

(56) References Cited

U.S. PATENT DOCUMENTS

| | | | |
|---|---|---|---|
| 5,276,582 A | 1/1994 | Merrill et al. | |
| 5,602,409 A * | 2/1997 | Olney | 257/362 |
| 5,717,559 A * | 2/1998 | Narita | 361/56 |
| 6,365,924 B1 * | 4/2002 | Wang et al. | 257/110 |
| 6,483,168 B1 * | 11/2002 | Chiu | 257/539 |
| 6,891,230 B2 | 5/2005 | Yu | |
| 7,002,216 B2 * | 2/2006 | Huang | 257/355 |

(Continued)

FOREIGN PATENT DOCUMENTS

KR 1020060122813 11/2006

(Continued)

OTHER PUBLICATIONS

PCT Application No. PCT/US2009/031204; Search Report and Written Opinion; mailed Sep. 8, 2009.

(Continued)

*Primary Examiner* — Jared J Fureman
*Assistant Examiner* — Scott Bauer
(74) *Attorney, Agent, or Firm* — Ingrassia Fisher & Lorenz, P.C.

(57) ABSTRACT

An electrostatic discharge (ESD) protection device (41, 51, 61, 71, 81) coupled across input-output (I/O) (22) and common (23) terminals of a core circuit (24) that it is intended to protect from ESD events, comprises, one or more serially coupled resistor triggered ESD clamp stages (41, 41', 41''; 71, 71', 71''), each stage (41, 41', 41''; 71, 71', 71'') comprising first (T1, T1', T1'', etc.) and second transistors (T2, T2', T2''' etc.) having a common collector (52, 52', 52'') and first (26, 26', 26'') and second (36, 36', 36'') emitters providing terminals (32, 42; 32', 42'; 32'', 42'') of each clamp stage (41, 41', 41''; 71, 71', 71. A first emitter (25) of the first stage (41, 71) couples to the common terminal (23) and a second emitter (42'') of the last stage (41'', 71') couples to the I/O terminals (22). Zener diode triggers are not used. Integrated external ESD trigger resistors (29, 29', 29''; 39, 39', 39'') (e.g., of poly SC) are coupled between the base (28, 28', 28''; 38, 38', 38'') and emitter (26, 26', 26''; 36, 36', 36'') of each transistor (T1, T1', T1''; T2, T2', T2''). Different resistor values (e.g., ~0.5 k to 150 k Ohms) give different ESD trigger voltages. Cascading the clamp stages (41, 41', 41''; 71, 71') gives even higher trigger voltages. The ESD trigger resistances (29, 29', 29''; 39, 39', 39'') are desirably located outside the common collector-isolation wall (741, 742, 743; 741', 742', 743''**) surrounding the transistors (T1, T1', T1''; T2, T2', T2'').

19 Claims, 5 Drawing Sheets

U.S. PATENT DOCUMENTS

| | | | |
|---|---|---|---|
| 7,164,566 | B2 | 1/2007 | Xu et al. |
| 2001/0043449 | A1 | 11/2001 | Okushima |
| 2005/0083618 | A1* | 4/2005 | Steinhoff et al. ............... 361/56 |

FOREIGN PATENT DOCUMENTS

KR    1020070056053    5/2007

OTHER PUBLICATIONS

Wang, A., et al., A novel dual-direction IC ESD Protection Device, Proceedings of 7th IPFA '99 Singapore, pp. 151-155.

Coffing, D., et al., Analysis of a Zener-Triggered Bipolar ESD Structure in a BiCMOS Technology, IEEE BCTM 1.2, Sep. 1998. pp. 31-34.

Joshi, S., et al., An analysis of bipolar breakdown and its application to the design of ESD protection circuits, IEEE 01CH137169. 39th annual International Reliability Physics Symposium, Orlando, Florida, 2001, pp. 240-245.

Freescale Semiconductor, Inc., Eletrostatic Discharger Protection Circuits, Figure A and B ( 1 page).

* cited by examiner

RESISTOR TRIGGERED ELECTROSTATIC DISCHARGE PROTECTION

FIELD OF THE INVENTION

The present invention generally relates to electrostatic discharge (ESD) protection of electronic elements and, more particularly, ESD protection of semiconductor components and integrated circuits.

BACKGROUND OF THE INVENTION

Modern electronic devices, especially semiconductor (SC) devices and integrated circuits (ICs) are at risk of damage due to electrostatic discharge (ESD) events. It is well known that electrostatic discharge from handling SC devices and ICs, by humans or machines or both, is a source of such excess voltage. Accordingly, it is commonplace to provide an ESD clamp (voltage limiting device) across the input/output (I/O) and other terminals of such SC devices and IC's. FIG. 1 is a simplified schematic diagram of circuit 10 wherein ESD clamp 11 is placed between input/output (I/O) terminals 22 and ground or common terminal 23 of a SC device or IC to protect the other devices on the chip, that is, to protect circuit core 24 which is also coupled to I/O terminals 22 and common (e.g., "GND") terminal 23. Zener diode symbol 11' within ESD clamp 11 indicates that the function of ESD clamp 11 is to limit the voltage than can appear across circuit core 24 irrespective of the voltage applied to external I/O and GND terminals 22, 23. As used herein, the abbreviation "GND" is intended to refer to the common or reference terminal of a particular circuit or electronic element, irrespective of whether it is actually coupled to an earth return, and the abbreviation "I/O" is intended to include any external terminals other than "GND".

FIG. 2 is a simplified schematic diagram illustrating internal components of prior art ESD clamp 21 which is inserted in circuit 10 in place of ESD clamp 11. ESD clamp 21 comprises bipolar transistor 25, having emitter 26, collector 27 and base 28, resistance 19 and Zener diode 130 having terminals 131, 132. Zener diode 130 can also exhibit some small inherent resistance. Resistance 19 can include any inherent contact resistance and the effect of the inherent base resistance (not shown). In applications employing Zener diode 130 it is common to directly connect the base and emitter contacts, in which case resistance 19 is small. The purpose of resistance 19 in ESD clamp 21 is not to provide triggering, since this is provided by Zener diode 130 but to keep base 28 and emitter 26 at substantially the same potential unless there is an ESD event, so that in normal operation of circuit 10, ESD clamp 21 does not interfere with the operation of circuit core 24. When the voltage across terminals 22, 23 rises beyond a predetermined limit, Zener diode 130 turns on, thereby switching bipolar transistor 25 into conduction and desirably clamping the voltage across terminals 22, 23 at a level below a value capable of damaging circuit core 24.

FIG. 3 is a simplified schematic diagram illustrating internal components of prior art ESD clamp 31 which is inserted in circuit 10 in place of ESD clamp 11. ESD clamp 31 comprises bipolar transistor 25, having emitter 26, collector 27 and base 28 and resistor 29. Resistor 29 is generally much larger than the inherent base and contact resistance. Resistor 29 is used to trigger bipolar transistor 25 into conduction when an ESD event occurs. When an ESD event arrives across terminals 22, 23 the collector-base voltage rises very rapidly and a small but finite leakage current begins to flow through the reverse biased collector base junction and through resistor 29. By using a value for resistor 29 that is large compared to the inherent base resistance, sufficient voltage is developed across resistor 29 to bias the emitter-base junction into conduction, thereby turning on transistor 25 and providing ESD protection by clamping the external voltage at a level below that capable of causing damage to circuit core 24. After the ESD transient has passed, resistor 29 discharges any charge stored on the emitter base junction, thereby returning transistor 25 to its non-conductive state so that in normal operation of circuit 10, ESD clamp 31 does not interfere with the operation of circuit core 24.

Design, construction and operation of such ESD devices is described for example in commonly owned U.S. Pat. No. 7,164,566 B2 "Electrostatic Discharge Protection Device and Method Therefore" by Hongzhong Xu et al, and further described by Danielle Coffing and Richard Ida in "Analysis of a Zener-Triggered Bipolar ESD Structure in a BiCMOS Technology", IEEE BC™ 1998, pages 31-34, and by Joshi, Ida, Givelin and Rosenbaum in "An Analysis of Bipolar Breakdown and its Application to the Design of ESD Protection Circuits", IEEE 01CH37167, 39th Annual International Reliability Physics Symposium, Orlando, Fla., 2001, pages 240-245. FIG. 4 is an illustration of a typical current-voltage characteristic of an ESD clamp, where voltage Vt1 is referred to as the trigger voltage and voltage Vh is referred to as the holding voltage.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
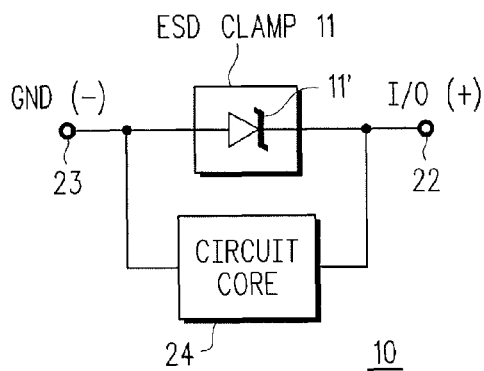
FIG. 1 is a simplified schematic diagram of a generalized ESD protection circuit using an ESD clamp to protect a circuit core from ESD events.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner.

Figure 2:
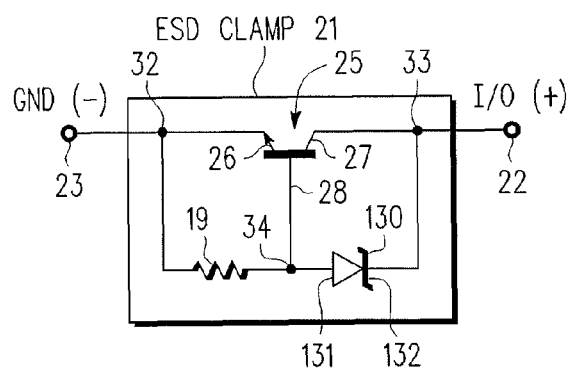
FIG. 2 is a simplified schematic diagram illustrating internal components of a prior art ESD clamp.
Figure 3:
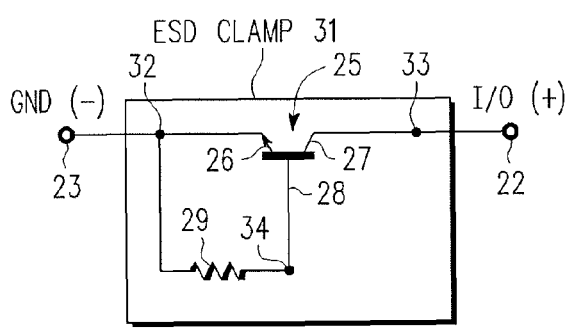
FIG. 3 is a simplified schematic diagram illustrating internal components of a further prior art ESD clamp.

While the circuits of FIGS. 2 and 3 can be effective in providing ESD protection, further improvements are desirable. Accordingly, there is an ongoing need to provide improved ESD clamps, especially ESD clamps that are adapted to achieve a variety of predetermined trigger voltages, and that are bidirectional so as to conserve chip area, and that are modular in nature so as to be electrically stackable, and that are less sensitive to manufacturing variations that can adversely affect manufacturing yield. Other desirable features and characteristics of the present invention will become apparent from the subsequent detailed description of the invention and the appended claims, taken in conjunction with the accompanying drawings and this background of the invention.

Figure 5:
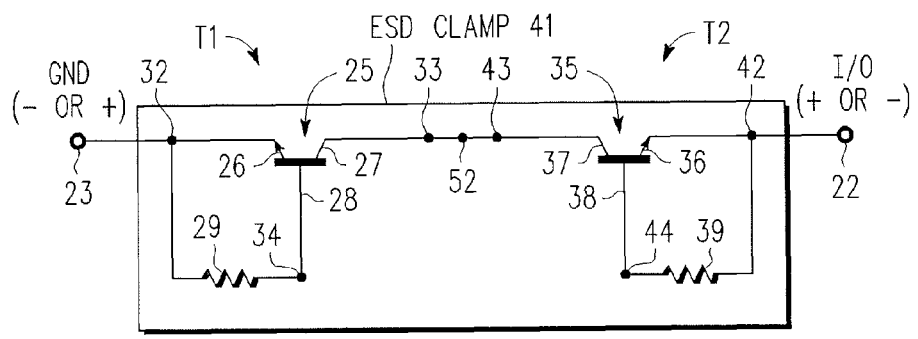
FIG. 5 is a simplified schematic diagram illustrating internal components of an ESD clamp according to an embodiment of the present invention.

FIG. 5 is a simplified schematic diagram illustrating internal components of ESD clamp 41, according to an embodiment of the present invention. ESD clamp 41 is used in generalized protection circuit 10 in place of ESD clamp 11. ESD clamp 41 differs from prior art ESD clamps 21, 31 of FIGS. 2 and 3 in that it utilizes two mirror coupled transistor stages T1 and T2 joined at node 52 and further does not have Zener diode 130. Transistor stage T1 comprises transistor 25 analogous to transistor 25 of FIGS. 2-3 with emitter 26, collector 27 and base 28, plus resistor 29, coupled in generally the same manner as in FIGS. 2 and 3. The same reference numbers are used for transistor stage T1 and ESD clamp 31 of FIG. 3, to indicate that the individual elements are analogous but not necessarily identical. Resistor 29 is coupled between base 28 at node 34 and emitter 26 at node 32. Node 32 is adapted to be coupled to GND terminal 23 of ESD protection circuit 10 of FIG. 1. Transistor stage T2 comprises transistor 35 having emitter 36, collector 37 and base 38. Resistor 39 is coupled between base 38 at node 44 and emitter 36 at node 42. Node 43 of Transistor stage T2 is coupled to node 33 of transistor stage T1 via node 52. Nodes 33, 52 and 43 are shown as separate nodes merely for convenience of description and can be combined. Node 42 of Transistor stage T2 is adapted to be coupled to input/output (I/O) terminals 22 of ESD circuit 10 of FIG. 1. It will be noted that while stages T1 and T2 of ESD clamp 41 individually resemble ESD clamp 31 of FIG. 3, they are serially coupled in opposition or in mirror arrangement, that is, node 43 of transistor stage T2 is coupled to node 33 of transistor stage T1, or to say it another way, collector 27 of transistor stage T1 is coupled to collector 37 of transistor stage T2 via common node 52. An advantage of ESD clamp 41 compared to ESD clamps 21 and 31 is that ESD clamp 41 is bi-directional, that is, it will respond, for example, to a positive going ESD transient at either of terminals 22 or 23 of ESD circuit 10. This is a significant advantage since it results in a substantial area saving in providing bi-directional ESD protection to circuit core 24, and thereby lowers the cost of manufacture of the SC device or IC containing circuit core 24 of FIG. 1.

Figure 4:
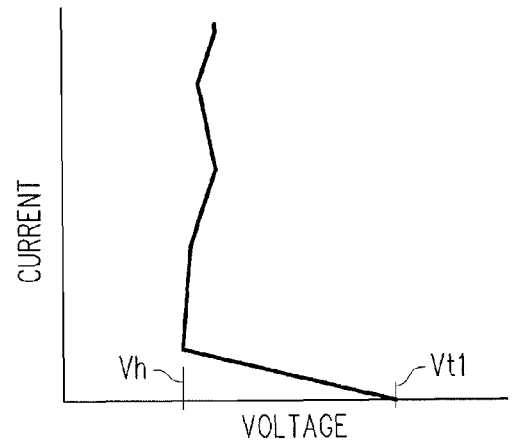
FIG. 4 is an illustration of a typical current-voltage characteristic of the ESD clamp of FIGS. 2 and 3.
Figure 6:
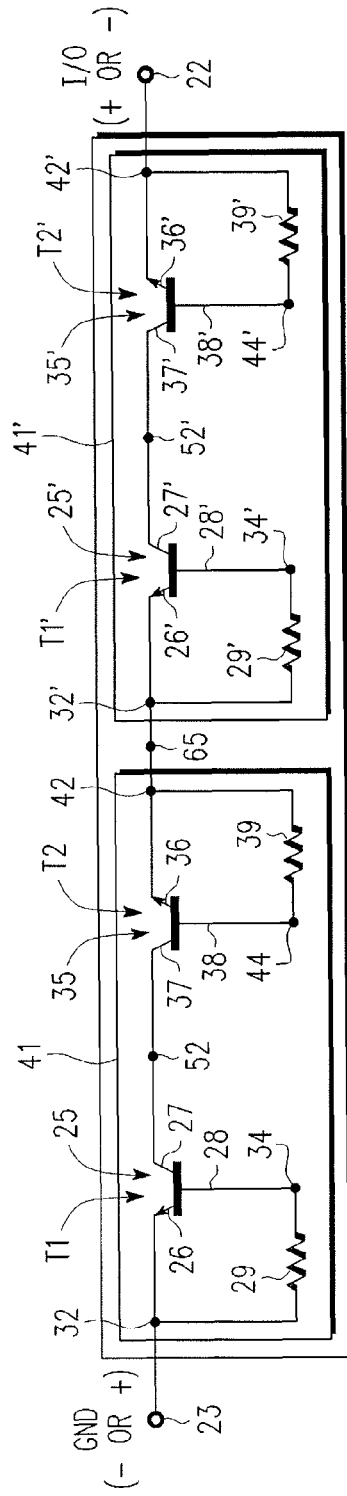
FIGS. 6-7 are simplified schematic diagrams illustrating internal components of an ESD clamp according to further embodiments of the present invention in which, in FIG. 6, two ESD clamps of the type shown in FIG. 5 have been electrically cascaded or stacked, and in FIG. 7, three ESD stages of the type shown in FIG. 5 have been electrically cascaded or stacked, in order to achieve higher and higher trigger voltage.
Figure 7:
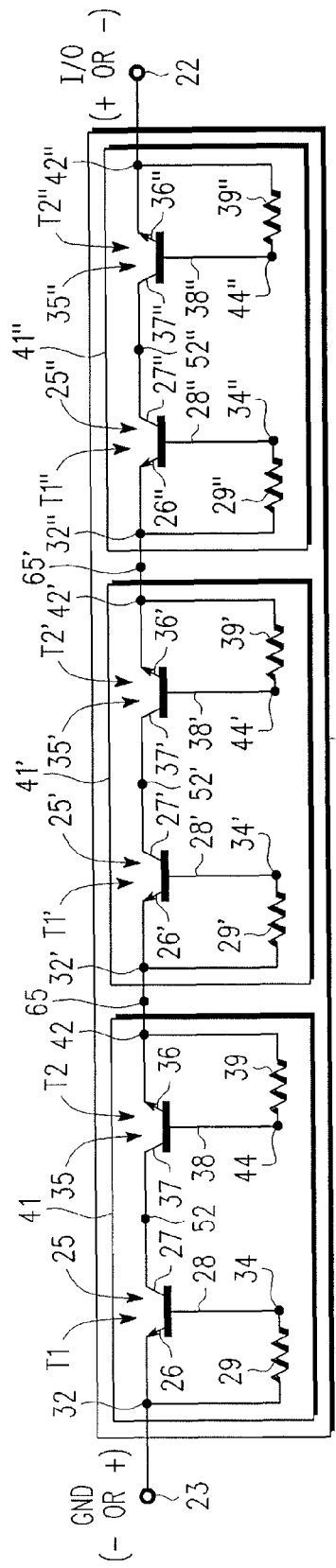

FIGS. 6-7 are simplified schematic diagrams illustrating internal components of ESD clamps 51, 61 according to further embodiments of the present invention, wherein it will be understood that clamps 51, 61 are substituted for clamp 11 in generalized ESD protection circuit 10 of FIG. 1. ESD clamp 51 differs from ESD clamp 41 of FIG. 5 in that it comprises two serially coupled ESD stages, that is, lower ESD stage or clamp 41 (e.g., clamp 41 of FIG. 5) and upper ESD stage or clamp 41' (also analogous to clamp 41 of FIG. 5). ESD clamp 61 differs from ESD clamp 51 of FIG. 6 in that it comprises three serially coupled ESD stages, that is, lower ESD stage or clamp 41, intermediate ESD stage or clamp 41' and upper or end ESD stage or clamp 41". The terms "lower" or "first" and "upper" or "end" or "last" are used herein merely to indicate that one of the serially coupled ESD stages (e.g., "lower or "first" ESD clamp 41) is coupled to so-called GND terminal 23 of ESD circuit 10 and another of the serially coupled ESD stages (e.g., "upper" or "end" or "last" clamp 41' or 41") is coupled to so-called I/O terminals 22 of ESD circuit 10 of FIG. 1, wherein GND is usually (but not always) the lower potential side of circuit 10 and the I/O terminals are coupled to what is usually (but not always) the higher potential side of ESD circuit 10. The designations of "lower" or "first" and "upper" or "end" or "last" are merely for convenience of reference and not intended to be limiting. Lower ESD stage or clamp 41 is described in connection with FIG. 5. Intermediate and upper ESD stages or clamps 41' and 41" are analogous to lower ESD stage or clamp 41 and the convention is adopted of identifying the individual components thereof analogous to those of lower ESD stage or clamp 41 by adding a prime to the individual reference numbers of intermediate stage or clamp 41' and a double prime to the individual reference numbers of upper or end or last stage or clamp 41", for example, emitters 26', 26" of intermediate and upper ESD stages or clamps 41', 41" are analogous to emitter 26 of lower ESD stage or clamp 41, collectors 27', 27" to collector 27, and so forth. ESD stages or clamps 41, 41', 41" are coupled so that: (i) node 42 of lower or first stage or clamp 41 is coupled to node 32' of intermediate stage or clamp 41' via node 65; (ii) node 42' of intermediate stage or clamp 41' is coupled to node 32" of end or upper or last stage or clamp 41" via node 65'; (iii) lower or bottom node 32 of lower or first stage of ESD clamp 41 is adapted to be coupled to GND terminal 23 of ESD circuit 10; and (iv) top or upper node 42" of upper or end or last stage of ESD clamp 41" is adapted to be coupled to I/O terminals 22 of ESD circuit 10. When only two stages are used, then stage or clamp 41" is omitted, and upper node 42' of stage or clamp 41' is coupled to I/O terminals 22. ESD clamp 51 of FIG. 6 and ESD clamp 61 of FIG. 7 are referred to as "stacked" or "cascaded" ESD clamps, in that they comprise an electrically serially coupled arrangement of individual bi-directional ESD stages or clamps 41, 41', 41", etc. FIG. 6 shows two-stack ESD clamp 51 and FIG. 7, shows three-stack ESD clamp 61. Intermediate nodes 42, 65 and 32 between ESD stacks or clamps 41 and 41', and intermediate nodes 42', 65' and 32" between ESD stacks or clamps 41' and 41" are shown as separate nodes merely for convenience of description and can be combined. Such a multiple "stacked" arrangement makes it possible to obtain higher trigger voltage and holding voltage (e.g., voltages Vt1 and Vh of FIG. 4) than are generally possible with a single ESD protection stage, such as is illustrated in FIG. 5.

While FIGS. 6 and 7 illustrate two-stack and three-stack configurations, respectively, any number N of ESD stages 41, where N=1, 2, 3, 4, . . . etc., may be stacked in generally the same manner and the "N-stack" substituted for ESD clamp 11 of FIG. 1. In such case, then the "first" of the N serially coupled ESD stages would ordinarily have its lower node $32_1$ (by analogy to stage 41) coupled to GND terminal 23 of circuit 10 of FIG. 1 and the Nth stage would ordinarily have its upper node $42_N$ (by analogy to stage 41") coupled to the I/O terminals of the circuit core 24 of FIG. 1, where the subscripts 1, 2, . . . N indicate the particular stage. In the same manner, the lower, intermediate and upper nodes of the $i_{th}$ ESD stage would be identified as $32_i$, $52_i$, and $42_i$ respectively, and the intermediate nodes between electrically adjacent ESD stages "i" and the "(i+1)" would be identified as $65_i$.

Figure 8:
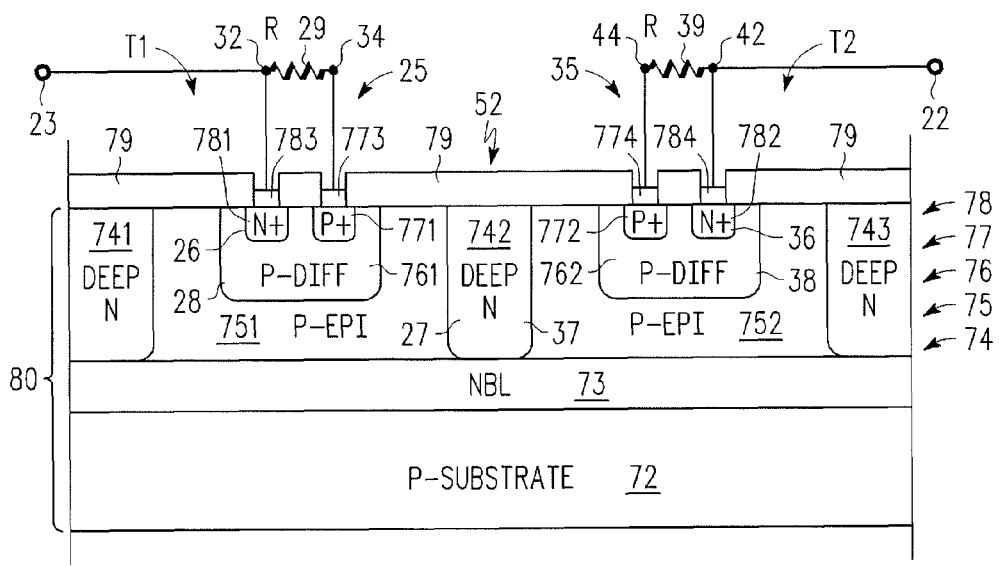
FIG. 8 is a simplified schematic cross-sectional view through the ESD clamp of FIG. 5 showing an arrangement of its internal regions according to an embodiment of the present invention and providing further detail.

FIG. 8 shows simplified schematic cross-sectional view 70 through ESD clamp 71 analogous to ESD clamp 41 of FIG. 5 showing an arrangement of its internal regions and providing further detail. For convenience of reference to the circuit schematic of ESD clamp 41 of FIG. 5, the corresponding physical regions of ESD clamp 71 are identified with the corresponding reference numbers used in FIG. 5. Referring now to both FIGS. 5 and 8, ESD clamp 71 comprises P-type substrate (P-SUBSTRATE) 72, N-type buried layer (NBL) 73 and N doped regions 741, 742, 743 (collectively 74). N-type buried layer 73 and N doped regions 74 serve as the collectors 27, 37 coupled by node 52 corresponding to N doped region 742. ESD clamp 71 further comprises P-type epi regions (P-EPI) 751, 752 (collectively 75) separated by N doped region 742 and P-type diffused regions (P-DIFF) 761, 762 (collectively 76) respectively in P-type epi regions 751, 752 that serve as base regions 28, 38. P+ base contact regions 771, 772 (collectively 77) are provided in diffused regions 76 wherein base contact region 771 is coupled to base node 34 and base contact region 772 is coupled to base node 44 (see also plan view 84 of FIG. 9). N+ emitter regions 781, 782 (collectively 78) are also provided in diffused regions 76, wherein emitter region 781 is coupled to emitter node 32 and emitter region 782 is coupled to emitter node 42 (see also plan view 84 of FIG. 9). Resistors 29, 39 couple emitter node 32 to base node 34 and emitter node 42 to base node 44, respectively. Resistors 29, 39 are desirably external resistors, that is, fabricated during the same manufacturing process and by the same general techniques used for preparing the core circuit and ESD protection device, but which are not formed within semiconductor 80. Conventional surface dielectric passivation layer 79 is also provided.

Figure 9:
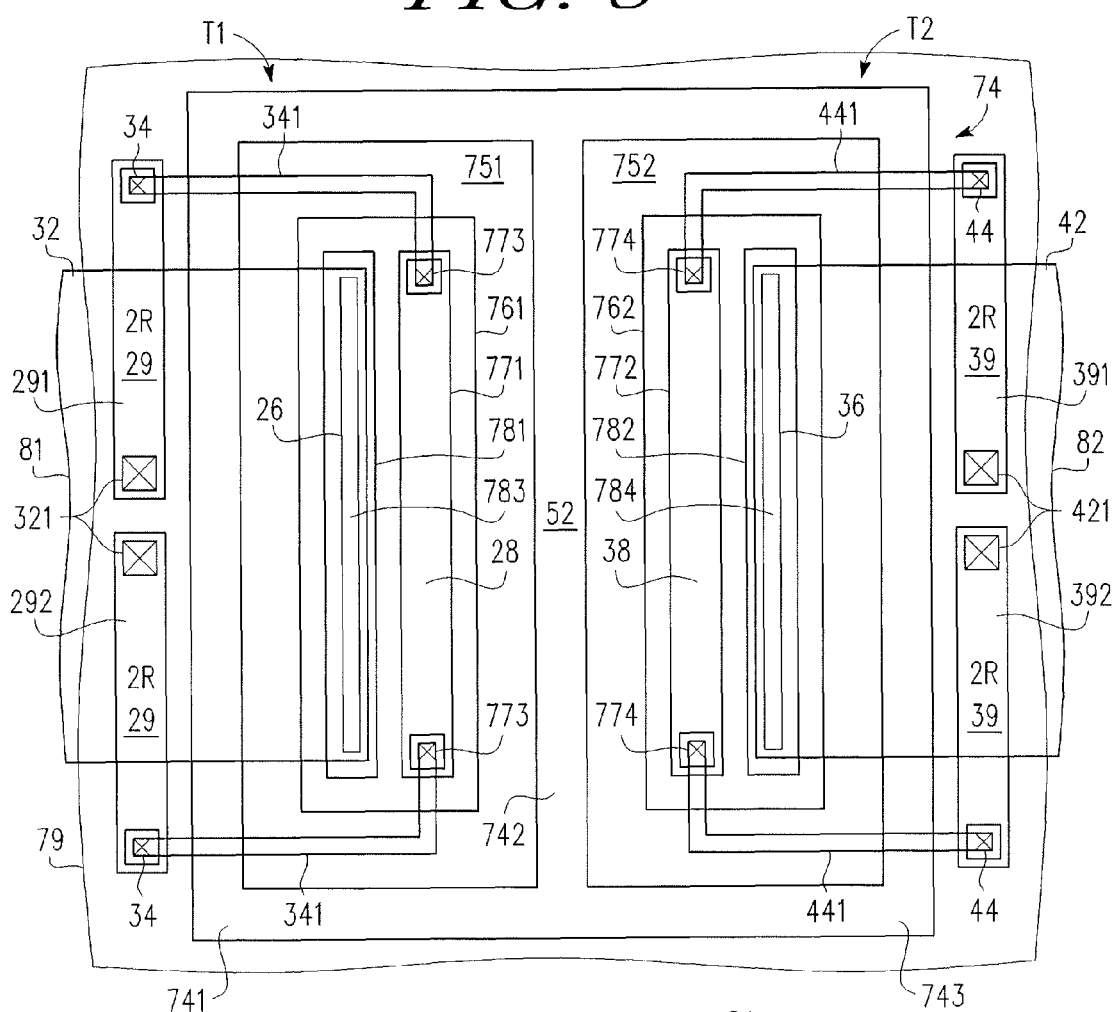
FIG. 9 is a simplified schematic plan view of the ESD clamp of FIG. 8.

FIG. 9 shows simplified schematic plan view 84 of the ESD clamp 71 of FIG. 8. Like reference numbers are used in FIGS. 8 and 9 to refer to like regions. N doped region 74 conveniently has a square plan view shape wherein N doped region 741 forms a central divider or partition, separating P-epi regions 751, 752. N doped region 741 corresponds to node 52 of the circuit of FIG. 5. P-diffused regions 761, 762 are located in P-epi regions 751, 752 respectively. N+ emitter regions 781, 782 and P+ base contact regions 771, 772 are located in P-diffused regions 761, 762 respectively. Emitter region 781 has emitter contact region 783 to which is coupled conductor 81, corresponding to node 32. Emitter region 782 has emitter contact region 784, to which is coupled conductor 82 corresponding to node 42. Conductors 81, 82 are desirably a highly conductive material such as a metal or heavily doped semiconductor or semi-metal so as to minimize the series resistance of the ESD clamp to the ESD transient. P+ base contact regions 771, 772 have ohmic contact regions 773, 774 coupled respectively to conductors 341, 441 which extend to resistors 29, 39 respectively. Resistors 29, 39 are desirably thin film resistors, as for example, and not intended to be limiting of poly-silicon or other poly-semiconductor (poly-SC), formed on the upper surface of dielectric passivation layer 79. In this embodiment, each of resistors 29, 39 is formed from the parallel combination of two resistors 291, 292 and 391, 392, each having a resistance value of 2R, where R is the desired emitter-base coupling resistance value. For example, contact nodes 34 on 2R resistances 291, 292 are coupled to base contacts 773 via conductors 341 and to emitter contact 783 via contacts 321 and emitter conductor 81, so that resistances 291, 292 of value 2R are electrically in parallel, thereby yielding the desired resistance value of R. Similarly, contact nodes 44 on 2R resistances 391, 292 are coupled to base contacts 774 via conductors 441 and to emitter contact 784 via contacts 421 and emitter conductor 82, so that resistances 391, 392 of value 2R are electrically in parallel, thereby yielding the desired resistance value of R. While the embodiment of FIG. 9 shows the resistors R of the circuit of FIG. 5 being provided by a parallel combination of two resistances each of value 2R, persons of skill in the art will understand that this is by way of example and not intended to be limiting. Resistances 29, 39 of value R may be provided by a parallel combination of resistors of value 2R, 4R, 6R, etc., or a series combination of resistors of value R/2, R/3, R/4 etc., or by a series-parallel combination of individual resistances of other sizes, or by forming resistances R from one or more strips of resistive material of known resistance per square, and then locating, for example, contacts 321, 421 at different distances along the resistive strip to produce the desired resistances R. These modifications can be accomplished merely by altering only the metal contact mask rather than altering multiple masks of the planar process used for forming such ESD clamps. As will be subsequently shown, the trigger voltage Vt1 can be changed by changing the values of resistance R of resistors 29, 39 of FIG. 5. Thus, the invented arrangement of incorporating resistances whose values can be altered by a minimal mask change allows a single process and basic mask set to be easily adapted to provide different desired values of Vt1. This is a significant advantage.

Figure 10:
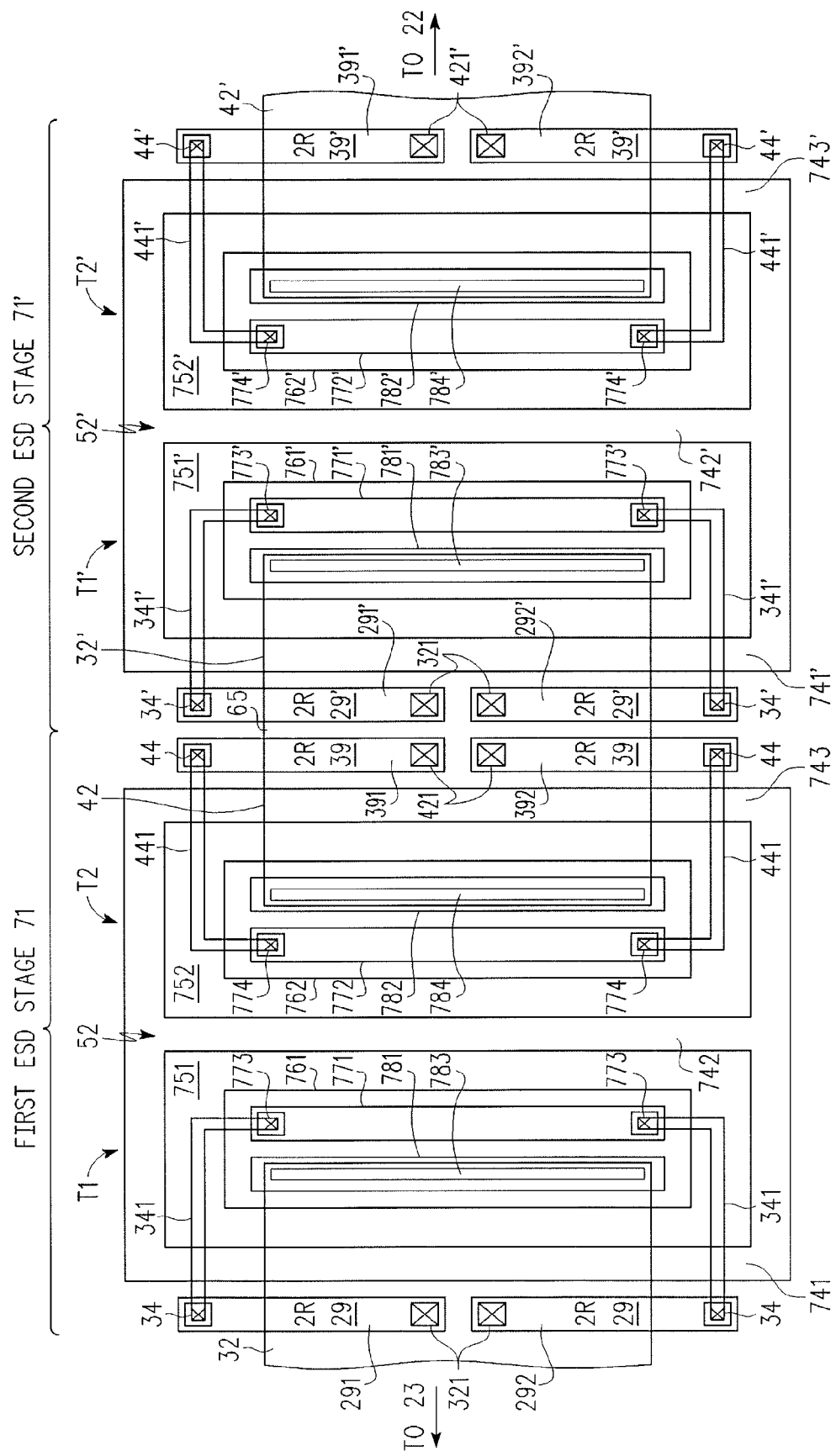
FIG. 10 is a simplified plan view of two ESD clamps of the type shown in FIG. 9 electrically cascaded or stacked according to the circuit of FIG. 6.

FIG. 10 is a simplified plan view 94 of two ESD clamps 84, 84' of the type shown in FIG. 9 electrically cascaded or stacked in series to provide ESD clamp 86 analogous to ESD clamp 51 of FIG. 6 comprising stages 41, 41'. The same reference numbers are used in FIG. 10 as in FIG. 9 to identify similar elements, wherein the elements of lower or first ESD stage 71, 84 are the same as in FIG. 9, and those of upper or end or last ESD stage 71', 84' are identified by adding a (') to the corresponding elements. Accordingly, the discussion of FIG. 9 is incorporated herein by reference as applied to FIG. 10. Conductor 81 is adapted to be coupled to GND terminal 23 of circuit 10 of FIG. 1 and conductor 82' is adapted to be coupled to I/O terminal 22 of circuit 10 of FIG. 1.

It has been found that the arrangements illustrated in FIGS. 5-10 provide very useful ESD protection when applied in circuit 10 of FIG. 1, and that the values of Vt1 can be easily adjusted to suit different circumstances, e.g., different circuit operating voltages and/or desired protection thresholds. The entries in Table I show how varying the value of resistances R in the various embodiments can be used to adjust the desired trigger voltage Vt1. The data of Table I was taken on ESD devices corresponding to the circuit shown in FIG. 5 and the physical implementation illustrated in FIGS. 8-9, where $R_{29}$ and $R_{39}$ are the values of resistors 29, 39 respectively.

TABLE I

Single Stack, Bi-directional, Resistor Triggered ESD device

| $R_{29} = R_{39} = 2\ k\Omega$ | $R_{29} = R_{39} = 4\ k\Omega$ | $R_{29} = R_{39} = 8\ k\Omega$ | $R_{29} = R_{39} = 20\ k\Omega$ |
|---|---|---|---|
| Vt1 = 44.41 volts | Vt1 = 32.9 volts | Vt1 = 27.44 volts | Vt1 = 23.5 volts |

It will be noted that by adjusting the values of R29 and R39, that the trigger voltage Vt1 can be adjusted over a wide range. In general, resistor values in the range of about 0.5 k to 150 k Ohm are useful, with resistor values in the range of about 1 k to 100 k Ohms being more convenient and resistor values in the range of about 1 k to 60 k Ohms being preferred. While the data presented in Table 1 is for the case where all of the resistors in the resistor triggered ESD clamp stages were set to the same values, that is, all stages had the same value resistors (e g., 2 k or 4 k or 8 k or 20 k Ohms) for the different tests, this is not essential and different stages may use different resistor values in order to fine tune the desired trigger voltage and/or to obtain different trigger voltages for different polarity ESD transients. This is a further advantage of using multiple resistor triggered ESD clamp stages as described herein.

Figure 11:
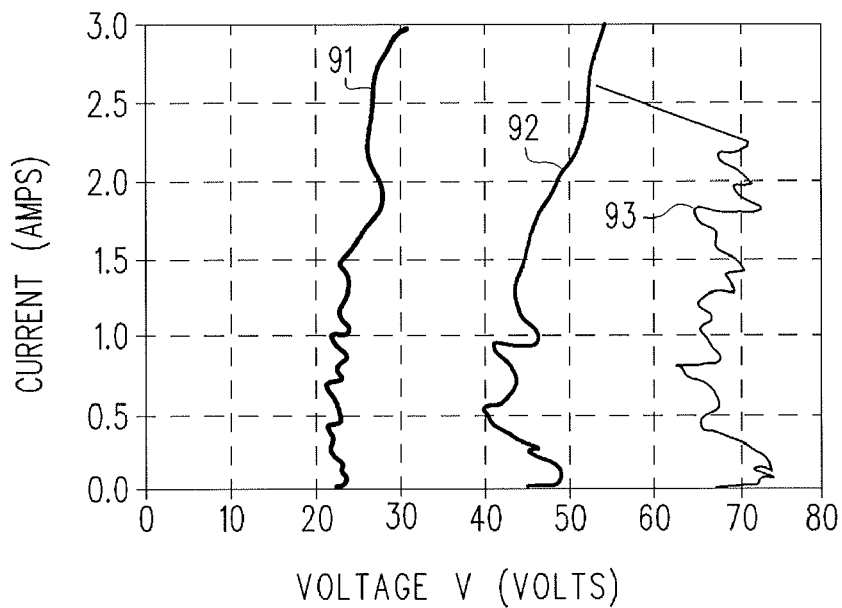
FIGS. 11-12 are plots of current verses voltage for ESD clamps according to several embodiments of the invention, illustrating how the trigger voltage Vt1 may be adjusted by changing values of R and/or by electrically cascading or stacking modular ESD stages.
Figure 12:
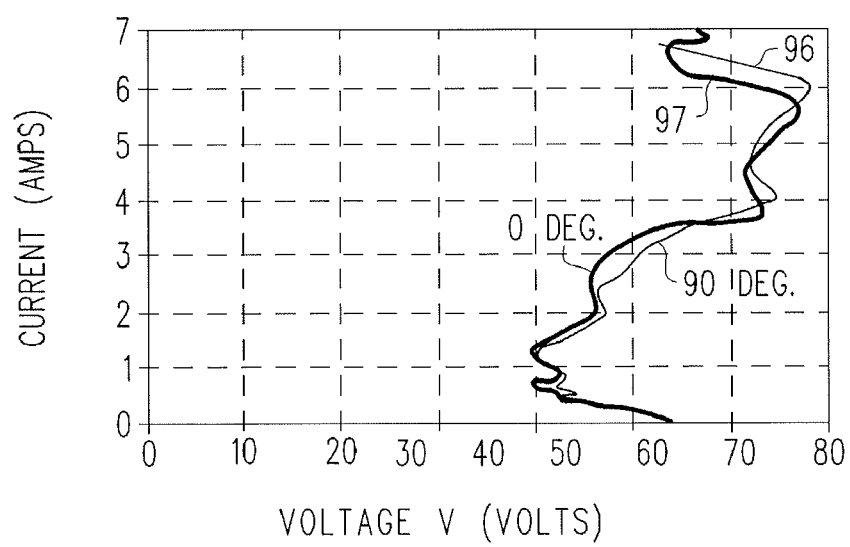

FIGS. 11-12 are plots of current I in amps verses voltage V in volts for ESD clamps according to several embodiments of the invention when subjected to simulated ESD transients obtained from a charged transmission line, for example, as are routinely used for human body model (HBM) testing of ESD clamps. FIG. 11 shows I-V plot 90 for single, double and triple stack or stage ESD clamps. Trace 91 shows the I-V plot obtained for single stage ESD clamp 41 of FIG. 5 having the cross-section and plan view layout illustrated in FIGS. 8 and 9, respectively. Trace 92 shows the I-V plot obtained for double stack or stage ESD clamp 51 of FIG. 6 having the plan view layout illustrated in FIG. 10 and cross-sectional views corresponding to two serially coupled arrangements of the cross-section shown in FIG. 8. Trace 93 shows the I-V plot obtained for triple stack or stage ESD clamp 61 of FIG. 5 having the cross-section and plan view layout corresponding to three serially coupled arrangements of ESD clamps 71 illustrated in FIGS. 8 and 9, respectively. In all three cases the resistor values $R_{29}$, $R_{39}$ were set at 40 k Ohms, that is $R_{29}=R_{39}=R_{29'}=R_{39'}=R_{29''}=R_{39''}=40$ k Ohms. Vt1 for the single stack (trace 91) was 23.7 volts, Vt1 for the double stack (trace 92) was 48.9 volts, and Vt1 for the triple stack (trace 93) was 73.9 volts, illustrating how different values of trigger voltage Vt1 (and holding voltages) may be obtained by electrically stacking ESD stages. For experimental convenience, the individual ESD stages in the two stack and three stack arrangements were substantially identical to the single stack arrangement and had the same resistance values $R_{29}$, $R_{39}$ but this is not essential. It may be desirable in some situations to have resistors $R_{29}$, $R_{29'}$, $R_{29''}$, etc., have the same resistance values and resistors $R_{39}$, $R_{39'}$, $R_{39''}$, etc., have different resistance values.

FIG. 12 shows I-V plot 95 for a double stack or stage ESD clamp corresponding to the circuit of ESD clamp 51 of FIG. 6 and cross-section and plan layout shown in FIGS. 8-9 respectively, with $R_{29}$, $R_{39}$=40 k Ohms but oriented in different directions on the same wafer. The device of trace 96 was oriented at 0 or 180 degrees and the device of trace 97 was oriented at 90 or 270 degrees. Stated another way, the devices of traces 96 and 97 were oriented at right angles to each other. The device corresponding to trace 96 gave Vt1=53.4 volts and the device of trace 97 gave Vt1=53.1 volts. This is an important result since it is well known in the art that ESD clamps often are orientation sensitive, that is, nominally identical ESD clamps on the same wafer or die, but with different azimuthal orientations in plan view can exhibit significantly different values of Vt1 and I-V behavior, to the detriment of performance and manufacturing yield. The fact illustrated in FIG. 12 that the invented arrangement does not exhibit this behavior is a significant and economically important result.

The two-stack results (trace 92) of FIG. 11 with 40 k Ohm resistors gave Vt1=48.9 and the two stack results of FIG. 12 (traces 96, 97) gave Vt1=53.4 and 53.1. The difference in Vt1 results=(53.25−48.9)/48.9=8.8% occurred because the devices of FIG. 12 where of smaller area than those of FIG. 11. While Vt1 depends strongly on the value of resistors $R_{29}$ $R_{39}$, etc., as shown by Table I, Vt1 is also weakly dependent on the device size, thereby providing another means for fine tuning the desired value of Vt1.

According to a first embodiment, there is provided an electronic device having input/output (I/O) and common terminals, comprising, a circuit core coupled between the I/O and common terminals, and one or more serially arranged resistor triggered bi-directional ESD clamp stages coupled between the I/O and common terminals. According to a further embodiment, there is only one resistor triggered bi-directional ESD clamp stage. According to a still further embodiment, each resistor triggered bi-directional ESD clamp stage comprises first and second serially coupled bipolar transistors, each bipolar transistor having an emitter, a base and a collector, and wherein the emitter of the first transistor is coupled to the common terminal and the emitter of the second transistor is coupled to the I/O terminals and the collectors of the first and second transistors are coupled together, and a first external resistor is coupled between the emitter and base of the first transistor and a second external resistor is coupled between the emitter and base of the second transistor. According to a yet further embodiment, there are two or more resistor triggered bi-directional ESD clamp stages and each bipolar transistor has an emitter, a base and a collector, and wherein the emitter of the second transistor of the first stage is coupled to the emitter of the first transistor of the second stage. According to a still yet further embodiment, there are three or more resistor triggered bi-directional ESD clamp stages and each bipolar transistor has an emitter, a base and a collector, and wherein the emitter of the second transistor of the first stage is coupled to the emitter of the first transistor of the second stage and the emitter of the second transistor of the second stage is coupled to the emitter of the first transistor of the third stage. According to a yet still further embodiment, the first and second resistors have values in the range of about 0.5 k Ohm to 150 K Ohms. According to another embodiment, the first resistors of each of the one or more serially arranged resistor triggered bi-directional ESD clamp stages have substantially the same first values and the second resistors of each of the one or more serially arranged resistor triggered ESD clamp stages have substantially the same second values. According to a still another embodiment, the first and second resistors have different values. According to a yet another embodiment, the first and second resistors of at least some of the one or more serially arranged resistor triggered bi-directional ESD clamp stages have different values.

According to a second embodiment, there is provided an integrated ESD protection device, having I/O and common terminals adapted to be coupled to I/O and common terminals of a core circuit being protected by the integrated ESD protection device, comprising, first and second bipolar transistors having a common collector region and comprising, first and second base regions of a first conductivity type, one base region for each bipolar transistor, a region of a second, opposite conductivity type extending beneath the first and second base regions, and separating and laterally surrounding the first and second base regions, and serving as the common collector region of the first and second bipolar transistors, a first emitter region of the second conductivity type within the first base region and a second emitter region of the second conductivity type within the second base region, wherein the first emitter region is adapted to be coupled to the common terminal of the core circuit and the second emitter region is adapted to be coupled to the I/O terminals of the core circuit, and first and second resistors coupled respectively between the emitter region and the base region of the first transistor and the emitter region and the base region of the second transistor, wherein the first and second resistors are located so that portions of the region of second, opposite, conductivity type are located between the first resistor and the first base region and between the second resistor and the second base region. According to a further embodiment, the first and second resistors are thin film resistors. According to a still further embodiment, the thin film resistors are formed of poly-semiconductor. According to a yet further embodiment, one or both of the first and second resistors each comprise multiple segments coupled in a series arrangement or a parallel arrangement or a series-parallel arrangement to provide the desired resistance values. According to a still yet further embodiment, the first and second resistors have substantially the same resistance value. According to a yet still further embodiment, the first and second resistors have different resistance values. According to another embodiment, the combination of the first and second transistors and the first and second resistors form a modular ESD clamp stage; and the integrated ESD protection device further comprises two or more serially coupled modular ESD clamp stages.

According to a third embodiment, there is provided an ESD protection device adapted to be coupled between common and I/O terminals of a core circuit desired to be protected, comprising, one or more bi-directional resistor triggered ESD stages, each stage comprising, two bipolar transistors having a common collector and isolation region, a base region for each transistor separated by a portion of the common collector and isolation region, separate emitter regions, one in each base region, base contact regions, one for each base region, and ESD trigger resistors external to the transistors, coupled between the emitter region and the base contact region of each transistor. According to a still further embodiment, the ESD trigger resistors lie laterally outside the collector and isolation region. According to a still further embodiment, the ESD trigger resistors are thin film resistors. According to a yet further embodiment, the ESD trigger resistors have resistance values in the range of about 0.5 k Ohms to 150 k Ohms.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. An electronic device having input/output (I/O) and common terminals, comprising:
    a circuit core coupled between the I/O and common terminals; and
    a plurality of serially arranged resistor triggered bi-directional electrostatic discharge (ESD) clamp stages coupled between the I/O and common terminals, wherein
    a first ESD clamp stage of the plurality of ESD clamp stages comprises serially coupled first and second bipolar transistors, a first external resistor coupled between an emitter and a base of the first bipolar transistor, and a second external resistor coupled between an emitter and a base of the second bipolar transistor, wherein the emitter of the first bipolar transistor also is coupled to the common terminal, collectors of the first and second bipolar transistors are coupled together, and wherein
    a second ESD clamp stage comprises serially coupled third and fourth bipolar transistors, a third external resistor coupled between an emitter and a base of the third bipolar transistor, and a fourth external resistor coupled between an emitter and a base of the fourth bipolar transistor, wherein the emitter of the third bipolar transistor is coupled to the emitter of the second bipolar transistor, collectors of the third and fourth bipolar transistors are coupled together, and wherein
    the second external resistor and the third external resistor are located in a region between the first ESD clamp stage and the second ESD clamp stage.

2. The device of claim 1, wherein there are three or more resistor triggered bi-directional ESD clamp stages, and wherein the emitter of the fourth transistor of the second ESD clamp stage is coupled to an emitter of a fifth transistor of a third ESD clamp stage.

3. The device of claim 1, wherein the first and second resistors have values in the range of about 0.5 k Ohm to 150 K Ohms.

4. The device of claim 1, wherein the first resistors of each of the one or more serially arranged resistor triggered bi-directional ESD clamp stages have substantially the same first values and the second resistors of each of the one or more serially arranged resistor triggered ESD clamp stages have substantially the same second values.

5. The device of claim 4, wherein the first and second resistors have different values.

6. The device of claim 1, wherein the first and second resistors of at least some of the one or more serially arranged resistor triggered bi-directional ESD clamp stages have different values.

7. The device of claim 1, wherein the device has a top surface, and the plurality of ESD clamp stages comprises:
    a substrate of a first conductivity type;
    a buried layer of a second and opposite conductivity type positioned below the top surface;
    doped, first regions of the second conductivity type extending from the top surface to the buried layer, wherein the buried layer and the first doped regions serve as collectors of the first, second, third, and fourth bipolar transistors;

epitaxial, second regions of the first conductivity type extending from the top surface to the buried layer and separated by the first regions;

diffused, third regions of the first conductivity type extending from the top surface and located within the second regions, wherein the third regions serve as base regions of the first, second, third, and fourth bipolar transistors;

base contact regions of the first conductivity type within the third regions; and emitter regions of the second conductivity type within the third regions.

8. The device of claim 1, wherein contact nodes of the second external resistor and the third external resistor are coupled, with a single conductor, to the emitter of the second bipolar transistor and to the emitter of the third bipolar transistor.

9. The device of claim 1, wherein one or more of the first, second, third, and fourth resistors comprise a parallel combination of resistors.

10. An integrated electrostatic discharge (ESD) protection device, having I/O and common terminals adapted to be coupled to I/O and common terminals of a core circuit being protected by the integrated ESD protection device, comprising:

a first ESD clamp stage having first and second bipolar transistors having a first common collector region and comprising:

first and second base regions of a first conductivity type, one base region for each of the first and second bipolar transistors, a first region of a second, opposite conductivity type extending beneath the first and second base regions, and separating and laterally surrounding the first and second base regions, and serving as the first common collector region of the first and second bipolar transistors, a first emitter region of the second conductivity type within the first base region and a second emitter region of the second conductivity type within the second base region, wherein the first emitter region is adapted to be coupled to the common terminal of the core circuit, and first and second resistors coupled respectively between the first emitter region and the first base region of the first transistor and the second emitter region and the second base region of the second transistor, wherein the first and second resistors are located so that portions of the first region of the second, opposite, conductivity type are located between the first resistor and the first base region and between the second resistor and the second base region; and a second ESD clamp stage serially coupled with the first ESD clamp stage and having third and fourth bipolar transistors having a second common collector region and comprising:

third and fourth base regions of the first conductivity type, one base region for each of the third and fourth bipolar transistors, a second region of the second conductivity type extending beneath the third and fourth base regions, and separating and laterally surrounding the third and fourth base regions, and serving as the second common collector region of the third and fourth bipolar transistors, a third emitter region of the second conductivity type within the third base region and a fourth emitter region of the second conductivity type within the fourth base region, and third and fourth resistors coupled respectively between the third emitter region and the third base region of the third transistor and the fourth emitter region and the fourth base region of the fourth transistor, wherein the third and fourth resistors are located so that portions of the region of second, opposite, conductivity type are located between the third resistor and the third base region and between the fourth resistor and the fourth base region, and the second resistor and the third resistor are located in a region between the first ESD clamp stage and the second ESD clamp stage.

11. The device of claim 10, wherein the first and second resistors are thin film resistors.

12. The device of claim 11, wherein the thin film resistors are formed of poly-semiconductor.

13. The device of claim 10, wherein one or both of the first and second resistors each comprise multiple segments coupled in a series arrangement or a parallel arrangement or a series-parallel arrangement to provide the desired resistance values.

14. The device of claim 13, wherein the first and second resistors have substantially the same resistance value.

15. The device of claim 13, wherein the first and second resistors have different resistance values.

16. An ESD protection device adapted to be coupled between common and I/O terminals of a core circuit desired to be protected, comprising:

a first bi-directional resistor triggered ESD stage comprising:

first and second bipolar transistors having a first common collector and isolation region, a base region for each of the first and second bipolar transistors separated by a portion of the first common collector and isolation region, separate emitter regions for each of the first and second bipolar transistors, one in each base region, base contact regions for each of the first and second bipolar transistors, one for each base region, and first and second ESD trigger resistors external to the first and second bipolar transistors, wherein the first ESD trigger resistor is coupled between the emitter region and the base contact region of the first bipolar transistor, and the second ESD trigger resistor is coupled between the emitter region and the base contact region of the second bipolar transistor; and a second bi-directional resistor triggered ESD stage comprising:

third and fourth bipolar transistors having a second common collector and isolation region, a base region for each of the third and fourth bipolar transistors separated by a portion of the second common collector and isolation region, separate emitter regions for each of the third and fourth bipolar transistors, one in each base region, base contact regions for each of the third and fourth bipolar transistors, one for each base region, and third and fourth ESD trigger resistors external to the third and fourth bipolar transistors, wherein the third ESD trigger resistor is coupled between the emitter region and the base contact region of the third bipolar transistor, and the fourth ESD trigger resistor is coupled between the emitter region and the base contact region of the fourth bipolar transistor, and wherein the second ESD trigger resistor and the third ESD trigger resistor are located in a region between the second and third bipolar transistors.

17. The ESD protection device of claim 16, wherein the ESD trigger resistors lie laterally outside the collector and isolation region.

18. The ESD protection device of claim 16, wherein the ESD trigger resistors are thin film resistors.

19. The ESD protection device of claim 16, wherein the ESD trigger resistors have resistance values in the range of about 0.5 k Ohms to 150 k Ohms.

* * * * *